3,368,900
Patented Feb. 13, 1968

3,368,900
POLYMERIZABLE COMPOSITIONS AND ELEMENTS

Marion Burg, Metuchen, N.J., assignor to E. I. du Pont de Nemours and Company, Wilmington, Del., a corporation of Delaware No Drawing. Filed June 3, 1964, Ser. No. 372,394
12 Claims. (Cl. 96—115)

ABSTRACT OF THE DISCLOSURE

Photopolymerizable compositions comprising (1) an addition polymerizable ethylenically unsaturated compound capable of forming a high polymer, (2) a polynuclear quinone photoinitiator, and (3) an aromatic aldehyde; and elements comprising a support and a layer of such compositions.

This invention relates to photopolymerizable compositions and elements. More particularly, this invention relates to such compositions and elements which contain polynuclear quinones, as addition polymerization initiators, and ethylenically unsaturated compounds capable of forming high polymers by photoinitiated polymerization. This invention also relates to dry processes for image reproduction using the above composition and elements.

The photopolymerization of ethylenically unsaturated compounds is a highly developed art and many initiators for increasing the speed of such polymerization are known.

The preparation of high quality photopolymerized relief printing plates using initiators has been described in detail in Plambeck U.S. 2,760,863 granted August 28, 1956. Also, various processes for image reproduction using the above photopolymerizable compositions are disclosed and claimed in Burg and Cohen U.S. 3,060,023, U.S. 3,060,024, U.S. 3,060,025; Heiart U.S. 3,060,026; and Seide U.S. Ser. No. 340,491 filed Jan. 27, 1964.

In Notley U.S. 2,951,758 issued Sept. 6, 1960, photopolymerizable compositions are disclosed which utilize polynuclear quinones as photoinitiators. Such photoinitiators have the advantage that they are thermally stable thus preventing thermally induced addition polymerization from taking place. Such photoinitiators also provide enhanced rates of photopolymerization.

It has now been found that the polymerization rate of the photopolymerizable systems described above which utilize polynuclear quinones as photoinitiators can be greatly increased by the addition to the photopolymerizable composition of an aromatic aldehyde which acts to accelerate the photoinitiating activity of the quinones.

The photopolymerizable composition of this invention comprises (1) at least one addition polymerizable ethylenically unsaturated compound capable of forming a high polymer by photoinitiated polymerization in the presence of an addition polymerization initiator therefor activatable by actinic light, (2) a polynuclear quinone having a carbocyclic ring and two intracyclic carbonyl groups of such a ring attached to intracyclic carbon atoms in a conjugated ring and having at least one aromatic carbocyclic ring fused to the ring containing the carbonyl groups as addition photopolymerization initiators, (3) an aromatic aldehyde as an accelerator for the photopolymerization reaction initiated by said polynuclear quinone.

The novel polymerizable compositions of this invention may contain, in addition to the three main ingredients described above, additional materials or adjuvants, e.g., (4) compatible binder materials including both addition and condensation polymers, (5) addition polymerization inhibitors and plasticizers, pigments, dyes, inorganic fillers, etc.

The compositions can be made by admixing (1) an ethylenically unsaturated compound capable of forming a high polymer, (2) the polynuclear quinone initiator, (3) an aromatic aldehyde and (4) a binder or viscosity modifier comprising a thermoplastic polymer and (5) a polymerization inhibitor and additional materials as indicated above. The components are thoroughly mixed by means of any conventional mixing or milling apparatus for plastic materials and formed into a sheet either by pressing, extrusion or coating depending on the consistency of the composition. Suitable addition polymerizable ethylenically unsaturated compounds for use as component (1) include unsaturated esters of polyols, particularly such esters of α-methylene carboxylic acids, e.g., ethylene diacrylate, diethylene glycol diacrylate, glycerol diacrylate, glycerol triacrylate, ethylene glycol dimethacrylate 1,3-propanediol dimethacrylate, 1,2,4-butanetriol trimethacrylate, 1,4-cyclohexanediol diacrylate, 1,4-benzenediol dimethacrylate, pentaerythritol tetramethacrylate, 1,3-propanediol diacrylate, 1,5-pentanediol dimethacrylate, the bis-acrylates and methacrylates of polyethylene glycols of molecular weight 200–500, the triacrylates of the reaction product of trimethylolpropane with from 1 to 20 moles of ethylene oxide, etc; unsaturated amides, particularly those of the α-methylene carboxylic acids, and especially those of the alpha-omega-diamines and oxygen-interrupted omega diamines, such as methylene bis-acrylamide, methylene bis-methacrylamide, ethylene bis-methacrylamide, 1,6-hexamethylene bis-acrylamide, diethylene triamine tris - methacrylamide, bis(gamma-methacrylamide-propoxy) ethane, p-hydroxyethyl methacrylate, ethyl α-(hydroxymethyl) acrylate, beta-methacrylamido-ethyl methacrylate, N-(β - hydroxyethyl) - β-(methacrylamide) ethyl acrylate and N,N-bis(β-methacrylyloxyethyl) acrylamide; vinyl esters such as divinyl succinate, divinyl adipate, divinyl phthalate, divinyl terepthalate, divinyl benzene-1,3-disulfonate and divinyl butane-1,4-disulfonate. An outstanding class of these preferred addition polymerizable components are the esters and amides of alpha-methylene carboxylic acids and substituted carboxylic acids with polyols and polyamines wherein the molecular chain between hydroxyl and amino groups is solely carbon or oxygen-interrupted carbon. The preferred compounds are multi-functional, but monofunctional monomers can also be used. The amount of monomer varies with the particular photopolymerizable composition used.

As members of the class of polynuclear quinone photopolymerization initiators (2) activatable by actinic light and thermally inactive below 185° C. as broadly defined above there may be mentioned: 2-ethyl anthraquinone, phenanthrenequinone, 9,10-anthraquinone, 1-chloroanthraquinone, 2-chloroanthraquinone, 2-methylanthraquinone, 2-tertbutylanthraquinone, octamethylanthraquinone, 1,4-napthoquinone, 2,3-benzanthraquinone, 1,2-benzanthraquinone, 2,3-dichloronaphthoquinone, 1,4-dimethylanthraquinone, 2,3 - dimethylanthraquinone, 2-methyl-1,4-naphthoquinone, 2-phenylanthraquinone, 2,3-diphenylanthraquinone, sodium salt of anthraquinone α-sulfonic acid, 3-chloro-2-methylanthraquinone, retenequinone, 7,8,9,10 - tetrahydronaphthacenequinone and 1,2,3,4-tetrahydrobenz(a)anthracene-7,12-dione.

A preferred class of aromatic aldehydes (3) suitable as accelerators includes: benzaldehyde, terephthalaldehyde, p-tolualdehyde, anisaldehyde, p-chlorobenzaldehyde, and p-dimethylaminobenzaldehyde, which are free from $CH_2=CH<$ groups.

Suitable thermoplastic polymers for use as components (4) include: copolyesters, e.g., those prepared from the reaction product of a polymethylene glycol of the formula $HO(CH_2)_nOH$, wherein $n$ is a whole number 2 to 10 inclusive, and (a) hexahydroterephthalic, sebacic and terephthalic acids, (b) terephthalic, isophthalic and sebacic acids, (c) terephthalic and sebacic (d) terephthalic and isophthalic acids, and (e) mixtures of copolyesters prepared from said glycols and (i) terephthalic, isophthalic and sebacic acids and (ii) terephthalic, isophthalic, sebacic, and adipic acids; nylons or polyamides, e.g., N-methoxymethyl polyhexamethylene adipamide; vinylidene chloride copolymers, e.g., vinylidene chloride/acrylonitrile, vinylidene chloride/methylacrylate, and vinylidene chloride/vinyl acetate copolymers; ethylene/vinyl acetate copolymers; cellulosic ethers, e.g., methyl cellulose, ethyl cellulose, and benzyl cellulose; polyethylene; synthetic elastomers, e.g., butadiene/acrylonitrile and chloro-2-butadiene-1,3 polymers; cellulose esters, e.g., cellulose acetate, cellulose acetate maleate, cellulose acetate succinate and cellulose acetate butyrate; polyvinyl esters, e.g., polyvinyl acetate/acrylate, polyvinyl acetate/methacrylate and polyvinyl acetate; polyacrylate and alpha-alkyl polyacrylate esters, e.g., poly(methyl methacrylate) and poly(ethyl methacrylate); high molecular weight polyethylene oxides of polyglycols having average molecular weights from about 4,000 to 1,000,000; polyvinyl chloride and copolymers, e.g., poly(vinyl chloride/acetate); poly(vinyl acetals), e.g., poly(vinyl butyral), poly(vinyl formal); polyformaldehydes; polyurethanes; polycarbonates; polystyrenes.

The invention will be further illustrated by, but is not intended to be limited to the following examples:

EXAMPLE I

A thermoplastic photopolymerizable composition was prepared by mixing:

| | Grams |
|---|---|
| Cellulose acetate butyrate (acetyl content 20.5%, butyryl content 26%, viscosity of 15–35 seconds determined by A.S.T.M. method D–1343–54T in the solution described as Formula A, A.S.T.M. method D–871–54T) | 11.25 |
| Polyethylene glycol diacrylate (average molecular weight of diol precursor is 300) | 11.25 |
| p-Methoxyphenol | 0.011 |
| Phenanthrenequinone | 0.225 |
| Calcocid Green S (C.I. 44090) | 0.118 |
| Benzaldehyde | 2.80 |
| Acetone | 75.0 |

The resulting photopolymerizable composition was coated on a 1-mil thick sheet of polyethylene terephthalate film base to a dry thickness of about 1.5 mils. It had a thermal transfer temperature of 104° C., said transfer temperature being that temperature at which the unexposed photopolymerizable material will stick or adhere within 10 seconds, under slight pressure, e.g., thumb pressure, to analytical filter paper (Schleicher & Schuell analytical filter paper #595).

A similar coating was prepared as a control whereby the benzaldehyde was excluded from the photopolymerizable composition. The transfer temperature of the control coating was 108° C.

By measuring the thermal transfer temperatures of each coating after exposing at a given intensity to a 400-watt mercury arc lamp (G.E. H400–R–1), the accelerating effect of the aldehyde could be observed. This is shown in the following table.

| Relative Exposure | Thermal Transfer Temperature, ° C. | |
|---|---|---|
| | Control | Benzaldehyde |
| 0 | 108 | 104 |
| 1 | 130 | 172 |
| 2.5 | 145 | 185 |
| 4 | >190 | >190 |

EXAMPLE II

A photopolymerizable composition was prepared by mixing:

| | Grams |
|---|---|
| Cellulose acetate butyrate (acetyl content 20.5%, butyryl content 26%; having a viscosity of 2.4–3.6 seconds determined as described in Example I) | 0.75 |
| Cellulose acetate (having a combined acetic number ca. 55 and a viscosity of 147–197 poises as determined by ASTM methods D–134–56 in a solution described as Formula A, ASTM method D–871–56) | 0.60 |
| Pentaerythritol triacrylate | 2.8 |
| p-Methoxyphenol | 0.003 |
| Polyethylene glycol (avg. M.W. 4000) dissolved in 1 ml. methanol | 0.10 |
| Phenanthrenequinone | 0.04 |
| Crystal Violet (C.I. 42555) | 0.01 |
| Acetone | 20.0 |

To seven batches of the above composition there was added 0.1 gram each of benzaldehyde, terephthalaldehyde, p-tolualdehyde, anisaldehyde, p-chlorobenzaldehyde, p-nitrobenzaldehyde and p-dimethylaminobenzaldehyde. An eighth batch was coated as a control. The resulting compositions were coated on supports as described in Example I and the surfaces of the coatings were pressure laminated to 1-mil polyethylene terephthalate films in the manner described in Heiart U.S. Patent 3,060,026, Oct. 23, 1962.

The elements were given ½-second exposures through the laminate and contacting $\sqrt[3]{2}$ step wedge (density range of 0.06 to 1.46) to a 5000-watt carbon arc light source set at a distance of 16 inches from the matrix sample.

After exposure, the exposed surfaces of the photopolymerizable compositions were placed in intimate contact with paper receptor sheets and placed in turn on a 6- x 6-inch platen which had a heat differential along its y-axis varying continuously from 50 to 150° C. A roller then passes over the matrix and receptor sheet at a speed of 20 inches/minute pressing them against the platen with a pressure of 25 lb./in.$^2$. The sheets were separated and by comparing the resulting transfergrams and determining at what step the exposed material transferred to the receptor sheet, the effect of the presence of the aldehyde on the polymerization speed could be determined. This would mean that, if thermal transfer of the photopolymerizable composition to the receptor sheet occurs only from areas corresponding to the higher density areas of the step wedge, the system is faster than one in which transfer occurs from areas corresponding to the lower density areas as well. By assigning the control coating containing no aromatic aldehyde a relative speed value of 1, the relative speeds of the samples containing the aldehydes were to be as follows:

| | Relative speed |
|---|---|
| Control | 1 |
| Benzaldehyde | 2.5–3 |
| Terephthaldehyde | 2.5 |
| Tolualdehyde | 3 |
| Anisaldehyde | 2 |
| p-Chlorobenzaldehyde | 3–4 |
| p-Nitrobenzaldehyde | 1.3 |
| p-Dimethylaminobenzaldehyde | 2.5–3 |

EXAMPLE III

A photopolymerizable composition having the basic ingredients of Example II and 0.1 gram of anisaldehyde was coated on a support. A control without the aldehyde was also prepared. Both coatings were overcoated with a mixture of waxes consisting of 70 parts of a natural paraffin having a melting point of 90° C., 30 parts of a synthetic paraffin made by the Fischer-Tropsch process and having a melting point in the range of 93–97° C., 2 parts of stearic acid and 2 parts of sorbitan monooleate. Upon exposure and thermal transfer as described in Example II it was found that the relative speeds of the control and test samples were the same as the equivalent tests in Example II.

EXAMPLE IV

A photopolymerizable composition was prepared by mixing:

| | Grams |
|---|---|
| Cellulose acetate butyrate (as in Example II) | 0.75 |
| Cellulose acetate (as in Example II) | 0.60 |
| Tetraacrylate addition product of pentaerythritol triacrylate and glycidyl acrylate | 2.8 |
| p-Methoxyphenol | 0.003 |
| Polyethylene glycol (having an average molecular weight of 4000) dissolved in 1 ml. methanol | 0.10 |
| Phenanthrenequinone | 0.04 |
| Crystal Violet (C.I. 42555) | 0.01 |
| Anisaldehyde | 0.10 |
| Acetone | 20.0 |

The resulting composition was coated and exposed as in Example II and the results showed that the anisaldehyde increased the speed 30% over the control.

EXAMPLE V

A photopolymerizable composition was prepared by mixing:

| | Grams |
|---|---|
| Cellulose acetate butyrate (as in Example II) | 0.75 |
| Cellulose acetate (as in Example II) | 0.60 |
| p-Methoxyphenol | 0.003 |
| 1,4-naphthoquinone | 0.04 |
| Crystal Violet (C.I. 42555) | 0.01 |
| p-Chlorobenzaldehyde | 0.1 |
| Pentaerythritol triacrylate | 2.8 |
| Acetone | 20 |

A similar composition was prepared as a control which contained no aldehyde. The compositions were coated on supports as described in Example I and the surfaces of the coatings were pressure laminated to 1-mil polyethylene terephthalate films as described in Example II. The laminated elements were given one-minute exposures through the 1-mil laminate film and a contacting $$\sqrt[6]{2}$$

step wedge (density range of 0.06 to 1.46) by means of an exposing device (i.e., a nuArc Plate Maker [flip-top] manufactured by the nuARC company, Chicago, Ill.). After exposure, thermal transfer images were made as described in Example II. By comparing the transferred images from the two elements, it was found that p-chlorobenzaldehyde increased the speed 50% over the control.

EXAMPLE VI

A coating composition similar to that of Example V was prepared using 2-ethylanthraquinone as the photoinitiator in place of the 1,4-napthoquinone. A control omitting the p-chlorobenzaldehyde was also prepared. All coatings and lamination were carried out as described in Example II. The elements were given thirty-second exposures as described in Example V and thermal transfers were made. A comparison of the transferred images of the $$\sqrt[6]{2}$$

step wedge showed a speed increase of 50% over the control.

EXAMPLE VII

A photopolymerizable element as described in Example II was prepared and reflectographically exposed by contacting the support side with a sheet of white paper bearing a message printed in black ink. The laminated side was contacted with a $$\sqrt[3]{2}$$

step wedge and the exposure and transfer made as described in Example II. A control element not containing benzaldehyde was also prepared. A high contrast well-defined copy of the original message was obtained from the benzaldehyde-containing element in those areas corresponding to the step wedge densities which allowed suitable intensities of light to pass through. The image quality of the control was poorer and the system had only half the speed of the benzaldehyde-containing element.

In addition to a plasticizer which can be added to the thermoplastic polymer constituent of the photopolymerizable composition there can be added non-thermoplastic polymeric compounds to give certain desirable characteristics, e.g., to improve adhesion to the base support, adhesion to the receptor support on transfer, wear properties, chemical inertness, etc. Suitable non-thermoplastic polymeric compounds include poly(vinyl alcohol), cellulose, anhydrous gelatin, phenolic resins and melamine-formaldehyde resins, etc. If desired, the photopolymerizable layers can also contain immiscible polymeric or non-polymeric organic or inorganic fillers or reinforcing agents which are essentially transparent at the wave-lengths used for the exposure of the photopolymeric material, e.g., the organophilic silicas, bentonites, silica, powdered glass, colloidal carbon, as well as various types of dyes and pigments, in amounts varying with the desired properties of the photopolymerizable layer. The fillers are useful in improving the strength of the composition, reducing tack and in addition, as coloring agents. Binders which are compatible with the particular monomer will be chosen of course. By compatibility is meant the ability of two or more constituents to remain homogeneously dispersed in one another. Some haze of the composition before or during exposure can be tolerated but in the preparation of image reproductions where fine detail is important, this should be avoided.

Suitable thermal polymerization inhibitors (5) that can be used in addition to the preferred p-methoxyphenol include hydroquinone, and alkyl and aryl-substituted hydroquinones and quinones, tert-butylcatechol, pyrogallol, copper resinate, naphthylamines, beta-naphthol, cuprous chloride, 2,6-di-tert-butyl p-cresol, phenothiazine, pyridine, nitrobenzene and dinitrobenzene. Other useful inhibitors include p-toluquinone and chloranil.

Various dyes, pigments, thermographic compounds and color-forming components can be added to the photopolymerizable compositions to give varied results after the thermal transfer. These additive materials, however, preferably should not absorb excessive amounts of light at the exposure wave length or inhibit the polymerization reaction.

Among the dyes useful in colored photopolymerizable compositions are Fuchsine (C.I. 42510), Auramine Base (C.I. 4100B), Calcocid Green S (C.I. 44090), Para Magenta (C.I. 42500), Tryparosan (S.I. 42505), New Magenta (C.I. 42520), Acid Violet RRH (C.I. 42425), Red Violet 5RS (C.I. 42690), Nile Blue 2B (C.I. 51185), New Methylene Blue GG (C.I. 51195), C.I. Basic Blue 20 (C.I. 42585), Iodine Green (C.I. 42556), Night Green B (C.I. 42115), C.I. Direct Yellow 9 (C.I. 19540), C.I. Acid Yellow 17 (C.I. 18965), C.I. Acid Yellow 29 (C.I. 18900), Tartrazine (C.I. 19140), Supramine Yellow G (C.I. 19300), Buffalo Black 10B (C.I. 27790), Naphthalene Black 12R (C.I. 20350), Fast Black L (C.I. 51215), Ethyl Violet (C.I. 42600), Pontacyl Wool Blue BL (C.I. 50315), and Pontacyl Wool Blue GL (C.I. 52320) (numbers obtained from the second edition of Color Index).

Suitable pigments, useful thermographic additives, and suitable color forming components are listed in Burg and Cohen U.S. Patent 3,060,023.

The photopolymerizable composition is preferably coated on a base support. Suitable support materials are preferably stable at the heating temperatures used in the thermal transfer processes of the above Burg and Cohen patents. Suitable bases or supports include those disclosed in U.S. Patent 2,760,863, glass, wood, paper, cloth, cellulose esters, e.g., cellulose acetate, cellulose propionate, cellulose butyrate, etc., and other plastic compositions such as polyolefins e.g., polypropylene, polyesters, e.g., polyethylene terephthalate. The support may have in or on its surface and beneath the photopolymerizable stratum an antihalation layer as disclosed in said patent or other substrata needed to facilitate anchorage to the base.

The supports can have an anti-blocking or release coating, e.g., finely divided inert particles in a binder such as silica in gelatin.

The coated elements containing compositions of this invention may be protected against the effects of oxygen inhibition by exposure in a vacuum frame, by a removable cover sheet, as described in assignee's U.S. patent of Heiart, No. 3,060,026 issued Oct. 23, 1962, by a drafting film, made as described in Example 1 of assignee's Van Stappen U.S. Patent 2,964,423 or by being overcoated with a cover stratum comprising at least one wax, as described in assignee's U.S. patent application, Burg Ser. No. 234,214 filed Oct. 30, 1962, now Patent No. 3,203,805. The wax overcoating may be applied from an aqueous dispersion as a melt, or from an organic solvent system.

The receptor support to which the image is transferred as in the thermal transfer processes must also be stable at the process temperatures. The particular support used is dependent on the desired use for the transferred image and on the adhesion of the image to the base. Suitable supports include paper including bond paper, resin and clay sized paper, resin coated or impregnated paper, cardboard, metal sheets, foils and meshes e.g., aluminum, copper, steel, bronze, etc.; wood, glass, nylon, rubber, polyethylene, linear condensation polymers such as the polyesters, e.g., polyethylene terephthalate, regenerated cellulose esters, e.g., cellulose acetate, silk, cotton, and viscose rayon fabrics or screens.

Since some polynuclear quinones are highly colored materials, a choice among the applicable quinones will be made depending on the use to which the photopolymerizable compositions are to be put. Ordinarily the color is of no moment in the very small concentrations which are effective in intitiating polymerizations, and in thin layers of polymerizable compositions the color does not affect transmission. However, where the compositions are to be used in thicker layers for optical or photographic purposes, quinones giving a yellowish or other tint in the concentrations necessary for initiating photopolymerization will be avoided. On the other hand, when the compositions are to be used in the preparation of photopolymerizable elements, where the color of the final product is of little significance, the choice of the quinone will depend on its efficiency.

The polynuclear quinones are useful as photoinitiators in concentrations up to the upper limit of their solubility. For example, the solubility of anthraquinone in triethylene glycol diacrylate is about 0.2% by weight. Some other quinones are more soluble but amounts greater than about 10% by weight do not usually lead to increased photo-response. The lower limit for effective utilization is about 0.001% by weight based on the total weight of the components used.

The aromatic aldehyde accelerators used in accordance with the invention are commercially available, inexpensive and simple to use. They are merely added to the photopolymerizable composition at the time of mixing in amounts of 2 to 30% and preferably 2 to 10%, based on the weight of the monomer.

In general, in the photopolymerizable compositions and elements of this invention, constituents (1) and (4) are present in the respective amounts of 97 to 3 and 3 to 97 parts, by weight.

The photopolymer systems embodying the use of aromatic aldehydes in conjunction with polynuclear quinones have numerous advantages because of their increased rate of light-initiated polymerization and increased thermal stability. Moreover, when the above compositions are used for the production of printing plates, the high rate of polymerization produces a superior image, for mechanical hardness of the photopolymer image and its resistance to solvent during development are materially enhanced by increased speed of polymerization. In other words, printing characters of greater hardness, sharpness, and fidelity are made possible by the use of aromatic aldehydes as accelerators of the photoinitiating activity of polynuclear quinones.

The photopolymerizable products of this invention are quite useful in the image reproduction processes of the Burg and Cohen and Heiart patents and assignee's applications listed above. It is in the dry processes of image reproduction as described in these patents and applications that higher polymerization speeds offer special advantages. Still further advantages will be apparent to those skilled in the art of image formation by photopolymerization.

What is claimed is:

1. A photopolymerizable composition comprising (1) at least one addition polymerizable ethylenically unsaturated compound capable of forming a high polymer by photoinitiated polymerization in the presence of an addition polymerization initiator therefor activatable by actinic light;

(2) a polynuclear quinone having a carbocyclic ring, two intracyclic carbonyl groups of such ring being attached to intracyclic carbon atoms in a conjugated ring, and having at least one aromatic carbocyclic ring fused to the ring containing the carbonyl groups; and (3) an aromatic aldehyde selected from the group consisting of benzaldehyde, terephthaldehyde, p-tolualdehyde, anisaldehyde, p-chlorobenzaldehyde and p-dimethylaminobenzaldehyde.

2. A composition according to claim 1 wherein the polynuclear quinone is present in an amount from about 0.001% to about 10% and the aromatic aldehyde is present in an amount of 2% to 30% by weight of the ethylenically unsaturated compound.

3. A composition according to claim 2 wherein said aldehyde is benzaldehyde.

4. A composition according to claim 2 wherein said aldehyde is p-chlorobenzaldehyde.

5. A photopolymerizable composition comprising (1) at least one addition polymerizable ethylenically unsaturated compound capable of forming a high polymer by photoinitiated polymerization in the presence of an addition polymerization initiator therefor activatable by actinic light;

(2) a polynuclear quinone having a carbocyclic ring, two intracyclic carbonyl groups of such ring being attached to intracyclic carbon atoms in a conjugated ring, and having at least one aromatic carbocyclic ring fused to the ring containing the carbonyl group;

(3) an aromatic aldehyde;

(4) a thermoplastic polymer; and (5) a polymerization inhibitor.

6. A composition according to claim 5 wherein the polynuclear quinone is present in an amount from about 0.001% to about 10% and the aromatic aldehyde is present in an amount of 2% to 30% by weight of the ethylenically unsaturated compound.

7. A composition according to claim 6 wherein said aldehyde is benzaldehyde.

8. A composition according to claim 6 wherein said aldehyde is p-chlorobenzaldehyde.

9. A photographic element having a sheet support bearing a photopolymerizable layer which comprises (1) at least one addition polymerizable ethylenically unsaturated compound capable of forming a high polymer by photoinitiated polymerization in the presence of an addition polymerization initiator therefor activatable by actinic light;

(2) a polynuclear quinone having a carbocyclic ring, two intracyclic carbonyl groups of such ring being attached to intracyclic carbon atoms in a conjugated ring, and having at least one aromatic carbocyclic ring fused to the ring containing the carbonyl groups; and (3) an aromatic aldehyde selected from the group consisting of benzaldehyde, terephthaldehyde, p-tolualdehyde, anisaldehyde, p-chlorobenzaldehyde and p-dimethylaminobenzaldehyde.

10. An element according to claim 9 wherein the polynuclear quinone is present in an amount from about 0.001% to about 10% and the aromatic aldehyde is present in an amount of 2% to 30% by weight of the ethylenically unsaturated compound.

11. An element according to claim 9 wherein said aldehyde is benzaldehyde.

12. An element according to claim 9 wherein said aldehyde is p-chlorobenzaldehyde.

References Cited

UNITED STATES PATENTS

| | | | |
|---|---|---|---|
| 2,670,286 | 2/1954 | Minsk et al. | 96—35.1 |
| 2,989,455 | 6/1961 | Neugebauer et al. | 204—159.23 |
| 3,041,172 | 6/1962 | Evans et al. | 96—115 |
| 3,046,127 | 7/1962 | Barney et al. | 96—35.1 |

J. TRAVIS BROWN, *Acting Primary Examiner.*

NORMAN G. TORCHIN, *Examiner.*

R. H. SMITH, *Assistant Examiner.*